(12) United States Patent
Lee et al.

(10) Patent No.: US 12,419,172 B2
(45) Date of Patent: Sep. 16, 2025

(54) DISPLAY APPARATUS HAVING A STORAGE CAPACITOR

(71) Applicant: LG Display Co., Ltd., Seoul (KR)

(72) Inventors: Young Hee Lee, Paju-si (KR); So Ra Park, Paju-si (KR); Hyun Haeng Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 466 days.

(21) Appl. No.: 18/074,331

(22) Filed: Dec. 2, 2022

(65) Prior Publication Data

US 2023/0217761 A1 Jul. 6, 2023

(30) Foreign Application Priority Data

Dec. 31, 2021 (KR) .......................... 10-2021-0194731

(51) Int. Cl.
*H10K 59/131* (2023.01)
(52) U.S. Cl.
CPC ................................ *H10K 59/1315* (2023.02)

(58) Field of Classification Search
CPC ............... H10K 59/131; H10K 59/122; H10K 59/1216; G09G 2300/0426
See application file for complete search history.

(56) References Cited

U.S. PATENT DOCUMENTS

2021/0335954 A1* 10/2021 Son ....................... H10K 59/131
2022/0320202 A1* 10/2022 Xian .................... H10K 59/131

* cited by examiner

*Primary Examiner* — Kevin M Nguyen
(74) *Attorney, Agent, or Firm* — Birch, Stewart, Kolasch & Birch, LLP

(57) ABSTRACT

Discussed is an apparatus including a storage capacitor. The storage capacitor can be disposed close to a data line. The storage capacitor can include a first capacitor electrode and a second capacitor electrode. A data conductive pattern can be electrically connected to the data line. The data conductive pattern can be disposed on a same layer as the second capacitor electrode. An end of the first capacitor electrode can be disposed between the second capacitor electrode and the data conductive pattern. Thus, in the display apparatus, a distortion of the storage capacitor due to the data conductive pattern being electrically connected to the data line can be prevented.

20 Claims, 6 Drawing Sheets

DISPLAY APPARATUS HAVING A STORAGE CAPACITOR

CROSS-REFERENCE TO RELATED APPLICATIONS

This application claims the benefit of priority to Korean Patent Application No. 10-2021-0194731, filed in the Republic of Korea on Dec. 31, 2021, the entire contents of which are hereby expressly incorporated by reference into the present application.

BACKGROUND OF THE DISCLOSURE

Field of the Invention

Embodiments of the present disclosure relate to a display apparatus in which a pixel driving circuit of each pixel area includes a storage capacitor.

Discussion of the Related Art

Generally, a display apparatus provides an image to a user. For example, the display apparatus can include a plurality of pixel areas. Each pixel area can realize a specific color. For example, a light-emitting device can be disposed in each pixel area. In this context, the light-emitting device can emit a light of a specific color. For example, the light-emitting device can include a light-emitting layer between two electrodes to emit the light of the specific color.

Each of the pixel area can be disposed between a gate line applying a scan signal and a data line applying a data signal. Each of the pixel area can include a pixel driving circuit to control the light-emitting device. The pixel driving circuit can be electrically connected to the gate line and the data line. For example, the pixel driving circuit can provide a driving current for one frame to the light-emitting device according to the gate signal. For example, the pixel driving circuit can include at least one thin film transistor and the storage capacitor.

The storage capacitor in each pixel area can be disposed close to the data line. In order to reduce a resistance of the data line, a data conductive pattern being electrically connected to the data line can be disposed on a portion of the data line. The data conductive pattern can be disposed on the same layer as one of the capacitor electrodes of the storage capacitor. However, in the display apparatus, the signal applied through the data line can affect a voltage stored in the storage capacitor by the data conductive pattern. Thus, in the display apparatus, the driving current generated by the pixel driving circuit of each pixel can be changed by the data signal.

SUMMARY OF THE DISCLOSURE

Accordingly, embodiments of the present disclosure are directed to a display apparatus that substantially obviates one or more problems due to limitations and disadvantages of the related art.

An object of embodiments of the present disclosure is to provide a display apparatus capable of preventing or reducing the change of the voltage stored in the storage capacitor due to the data signal.

Additional advantages, objects, and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus comprising a device substrate. A device buffer layer is disposed on the device substrate. A data line is disposed between the device substrate and the device buffer layer. A pixel driving circuit and a data conductive pattern are disposed on the device buffer layer. The pixel driving circuit includes a storage capacitor. The storage capacitor is spaced away from the data line. The data conductive pattern overlaps a portion of the data line. An over-coat layer is disposed on the pixel driving circuit and the data conductive pattern. A light-emitting device is disposed on the over-coat layer. The light-emitting device is electrically connected to the pixel driving circuit. The storage capacitor includes a first capacitor electrode and a second capacitor electrode. The second capacitor electrode is disposed on the first capacitor electrode. The data conductive pattern is electrically connected to the data line. The data conductive pattern is disposed on a same layer as the second capacitor electrode. An end of the first capacitor toward the data line cab be disposed between the data conductive pattern and the second capacitor electrode.

The second capacitor electrode can have a size larger than the first capacitor electrode.

The pixel driving circuit can include a driving thin film transistor. The driving thin film transistor can be electrically connected to the light-emitting device. The first capacitor electrode can be disposed on the same layer as a semiconductor pattern of the driving thin film transistor.

A drain electrode of the driving thin film transistor can be in contact with the first capacitor electrode.

The data conductive pattern and the second capacitor electrode can be disposed on the same layer as a gate electrode of the driving thin film transistor.

The second capacitor electrode can be in contact with the gate electrode of the driving thin film transistor.

The first capacitor electrode can include a first electrode layer and a second electrode layer. The second electrode layer can be disposed on the first electrode layer. A resistance of the second electrode layer can be smaller than a resistance of the first electrode layer.

An end of the first electrode layer can be disposed between an end of the second electrode layer and the data line.

A distance between an end of the second electrode layer and the second capacitor electrode can be smaller than a distance between an end of the first electrode layer and an end of the second electrode layer.

The data conductive pattern can have a shape of bar extending along the data line.

The storage capacitor can include a third capacitor electrode disposed on the same layer as the data line. The end of the second capacitor electrode can be disposed between the third capacitor electrode and the data line.

There is additionally provided a display apparatus that can include a gate line extending in a first direction on a substrate, a data line extending in a second direction on the substrate, a pixel circuit on the substrate, and including a first thin film transistor (TFT), a second thin film transistor (TFT), and a storage capacitor, the first TFT configured to transmit a data signal from the data line to the second TFT according to a gate signal from the gate line, and a conductive pattern electrically connected to the data line.

The storage capacitor can include a first capacitor electrode and a second capacitor electrode, and a first distance from an edge of the first capacitor electrode to an edge of the conductive pattern can be different from a second distance from an edge of the second capacitor electrode to the edge of the conductive pattern

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION OF THE EMBODIMENTS

Figure 1:
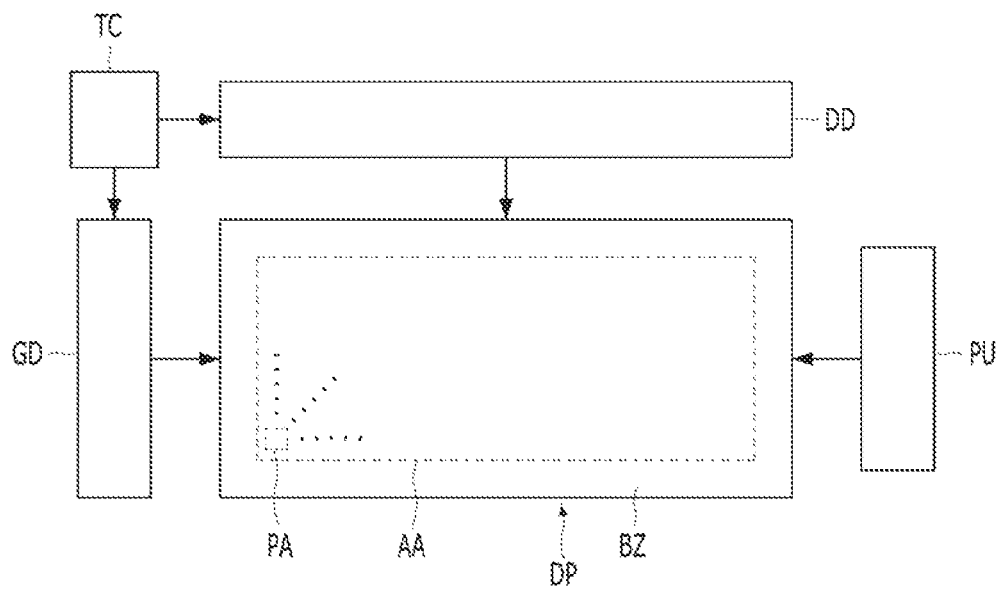
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be understood by those skilled in the art, and thus the present disclosure can be embodied in other forms and is not limited to the embodiments described below.

In addition, the same or similar elements can be designated by the same reference numerals throughout the specification and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element. However, the first element and the second element can be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment of the Present Disclosure

Figure 2:
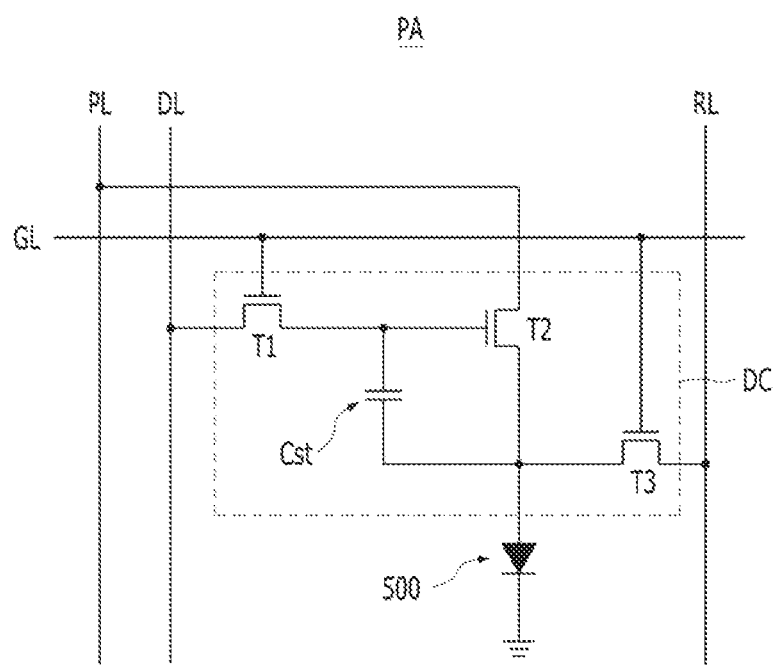
FIG. 2 is a view showing a unit pixel circuit in the display apparatus according to the embodiment of the present disclosure.

FIG. 1 is a view schematically showing a display apparatus according to an embodiment of the present disclosure. FIG. 2 is a view showing a unit pixel circuit in the display apparatus according to the embodiment of the present disclosure. All components of each display apparatus according to all embodiments of the present disclosure are operatively coupled and configured.

Referring to FIGS. 1 and 2, the display apparatus according to one embodiment of the present disclosure can include a display panel DP, a data driver DD, a gate driver GD, a timing controller TC and a power unit PU. Further, the display apparatus according to embodiments of the present disclosure can be of various types, including a light emitting display apparatus.

The display panel DP can generate an image being provided to a user. For example, the display panel DP can include an active area (or a display area) AA, and a bezel area BZ at a periphery of the bezel area BZ. The active area AA can include a plurality of pixel area PA. The active area AA can further include the data driver DD, the gate driver GD, the timing controller TC and the power unit PU can provide a signal for the operation of each pixel area PA through signal lines DL, GL, PL and RL. The signal lines DL, GL, PL and RL can include data lines DL, gate lines GL, power voltage supply lines PL and reference voltage supply lines RL. For example, the data driver DD can apply a data signal to each pixel area PA through the data lines DL, and the gate driver GD can apply a gate signal to each pixel area PA through the gate lines GL. The power unit PU can supply a power voltage to each pixel area PA through the power voltage supply lines PL, and supply a reference voltage to the each pixel area PA through the reference voltage supply lines RL. The timing controller TC can control the data driver DD and the gate driver GD. For example, the data driver DD can receive digital video data and a source timing control signal from the timing controller TC, and the gate driver GD can receive clock signals, reset clock signals and start signals from the timing controller TC.

Each of the pixel areas PA can display a specific color. For example, each of the pixel area PA can include a pixel driving circuit DC and a light-emitting device (or diode) 500 electrically connected to the pixel driving circuit DC. The pixel driving circuit DC can be electrically connected to the signal lines GL, DL, PL and RL. For example, the pixel driving circuit DC can be electrically connected to one of the data lines DL, one of the gate lines GL, one of the power voltage supply lines PL, and one of the reference voltage supply lines RL. The pixel driving circuit DC can supply a driving current corresponding to the data signal for one frame according to the scan signal. For example, the pixel driving circuit DC can include a first thin film transistor (TFT) T1, a second thin film transistor (TFT) T2, a third thin film transistor (TFT) T3 and a storage capacitor Cst.

Figure 3:
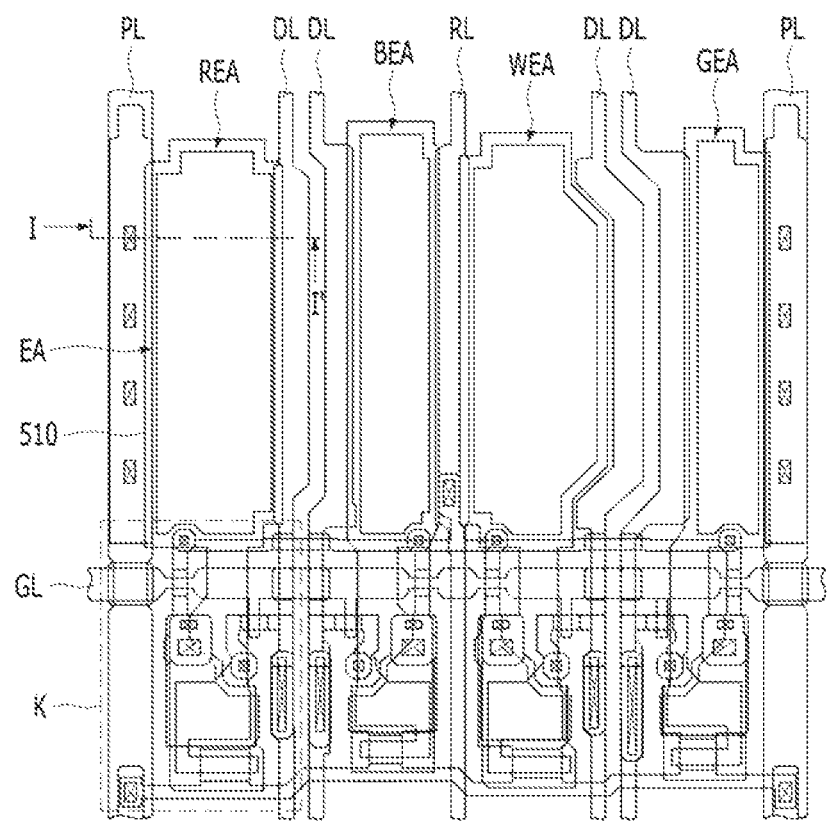
FIG. 3 is an enlarged view of a portion of a display area in the display apparatus according to the embodiment of the present disclosure.
Figure 4:
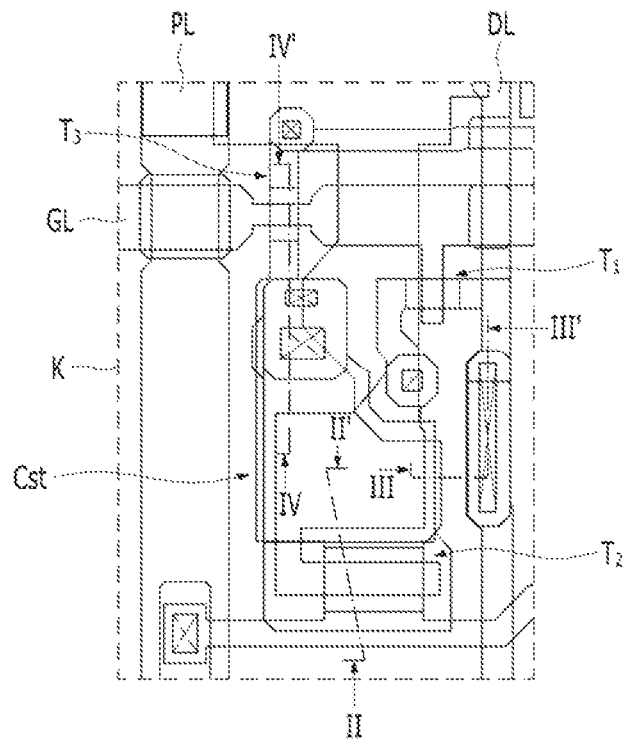
FIG. 4 is an enlarged view of K region in FIG. 3.
Figure 5:
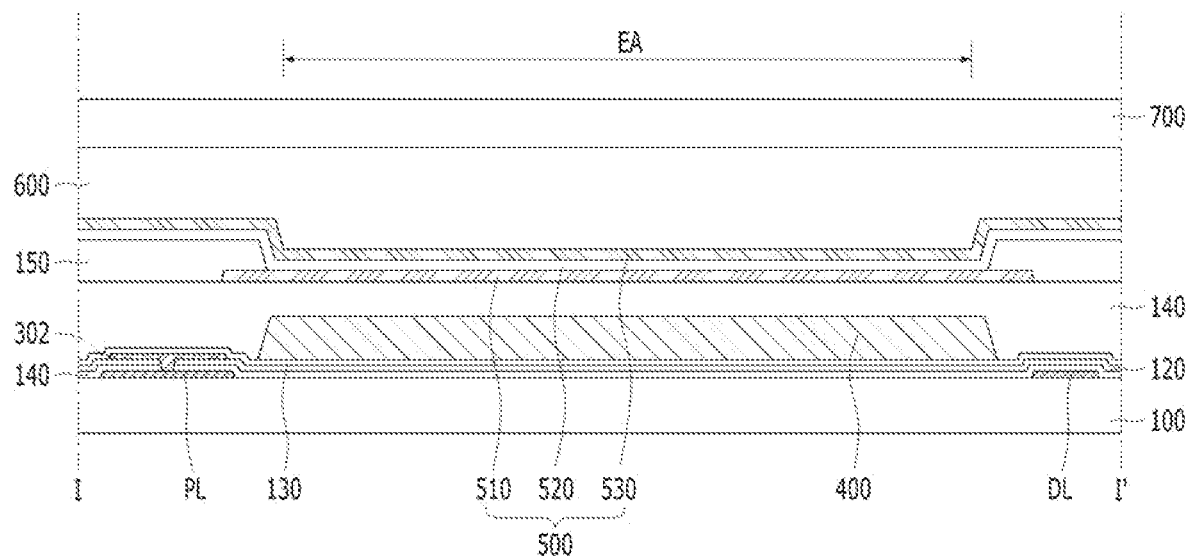
FIG. 5 is a view taken along I-I' of FIG. 3.
Figure 6:
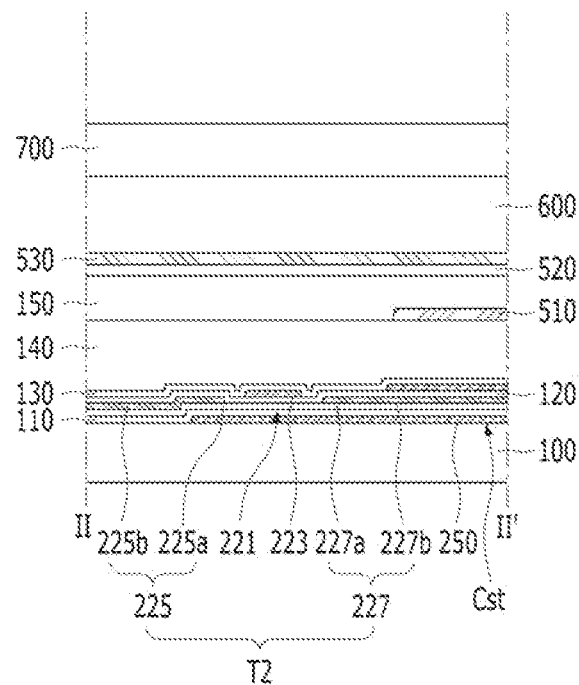
FIG. 6 is a view taken along II-II' of FIG. 4.
Figure 7:
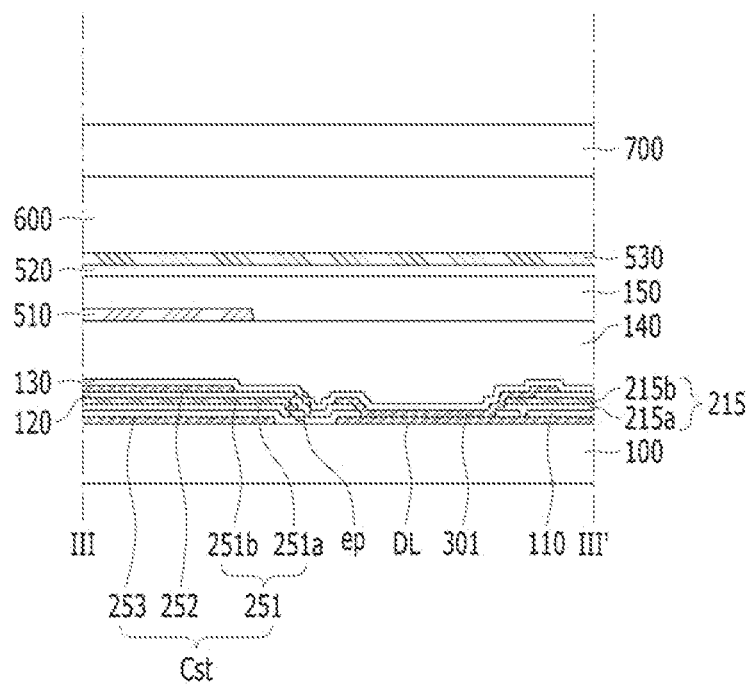
FIG. 7 is a view taken along III-III' of FIG. 4.
Figure 8:
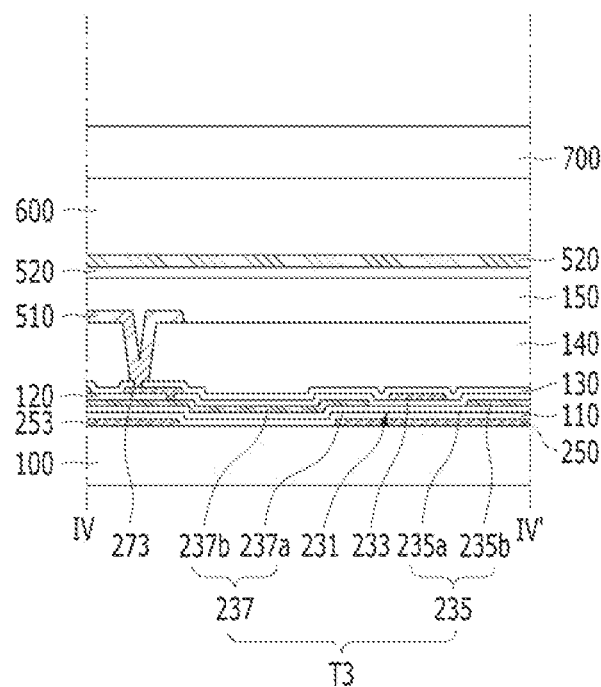
FIG. 8 is a view taken along IV-IV' of FIG. 4.

FIG. 3 is an enlarged view of a portion of a display area in the display apparatus according to the embodiment of the present disclosure. FIG. 4 is an enlarged view of K region in FIG. 3. FIG. 5 is a view taken along I-I' of FIG. 3. FIG. 6 is a view taken along II-II' of FIG. 4. FIG. 7 is a view taken along III-III' of FIG. 4. FIG. 8 is a view taken along IV-IV' of FIG. 4.

Referring to FIG. 2 to FIG. 8, the first thin film transistor T1 can include a first semiconductor pattern, a first gate electrode, a first source electrode 215 and a first drain electrode. The first thin film transistor T1 can transmit the data signal to the second thin film transistor T2 according to the gate signal. For example, the first gate electrode of the first thin film transistor T1 can be connected to one of the gate lines, and the first source electrode 215 of the first thin film transistor T1 can be connected to one of the data lines DL.

The second thin film transistor T2 can include a second semiconductor pattern 221, a second gate electrode 223, a second source electrode 225 and a second drain electrode 227. The second thin film transistor T2 can generate the driving current corresponding to the data signal. For example, the second gate electrode 223 of the second thin film transistor T2 can be connected to the first drain electrode of the first thin film transistor T1, and the second source electrode 225 of the second thin film transistor T2 can be connected to one of the power voltage supply lines PL. The light-emitting device 500 can be electrically connected to the second drain electrode 227 of the second thin film transistor T2. For example, the second thin film transistor T2 can be a driving thin film transistor which applies the driving current to the light-emitting device 500. A region of the display area corresponding to the light-emitting device 500 of each pixel area PA can be an emission area EA.

The first semiconductor pattern and the second semiconductor pattern 221 can include a semiconductor material. For example, the first semiconductor pattern and the second semiconductor pattern 221 can include an oxide semiconductor, such as IGZO, for example. The second semiconductor pattern 221 can include the same material as the first semiconductor pattern. The second semiconductor pattern 221 can be disposed on the same layer as the first semiconductor pattern. For example, the second semiconductor pattern 221 can be formed simultaneously with the first semiconductor pattern.

Each of the first semiconductor pattern and the second semiconductor pattern 221 can include a source region, a channel region and a drain region. The channel region can be disposed between the source region and the drain region. The source region and the drain region can have a resistance lower than the channel region. For example, the source region and the drain region can include a conductive region of an oxide semiconductor. The channel region can be a region of an oxide semiconductor, which can be not a conductive region.

The first gate electrode and the second gate electrode 223 can include a conductive material. For example, the first gate electrode and the second gate electrode 223 can include a metal, such as aluminum (Al), chrome (Cr), copper (Cu), molybdenum (Mo), titanium (Ti) and tungsten (W). The second gate electrode 223 can include the same material as the first gate electrode. The second gate electrode 223 can be disposed on the same layer as the first gate electrode. For example, the second gate electrode 223 can be formed simultaneously with the first gate electrode. A non-metallic conductive material can be used for the first gate electrode and the second gate electrode.

The first gate electrode can be disposed on the first semiconductor pattern. For example, the first gate electrode can overlap the channel region of the first semiconductor pattern. The second gate electrode 223 can be disposed on the second semiconductor pattern 221. For example, the second gate electrode 223 can overlap the channel region of the second semiconductor pattern 221. The first gate electrode can be insulated from the first semiconductor pattern, and the second gate electrode 223 can be insulated from the second semiconductor pattern 221. For example, the channel region of the first semiconductor pattern can have an electric conductivity corresponding to a voltage applied to the first gate electrode, and the channel region of the second semiconductor pattern 221 can have an electric conductivity corresponding to a voltage applied to the second gate electrode 223.

The first source electrode 215, the first drain electrode, the second source electrode 225 and the second drain electrode 227 can include a conductive material. The first drain electrode can include the same material as the first source electrode 215. For example, the first drain electrode can be disposed on the same layer as the first source electrode 215. The second drain electrode 227 can include the same material as the second source electrode 225. For example, the second drain electrode 227 can be disposed on the same layer as the second source electrode 225. The second drain electrode 227 can include the same material as the first drain electrode. For example, the second source electrode 225 and the second drain electrode 227 can be formed simultaneously with the first source electrode 215 and the first drain electrode.

The first source electrode 215 can be electrically connected to the source region of the first semiconductor pattern. The first drain electrode can be electrically connected to the drain region of the first semiconductor pattern. For example, each of the first source electrode 215 and the first drain electrode can be in direct contact with the first semiconductor pattern. The first source electrode 215 can have a multi-layer structure. For example, the first source electrode 215 can have a stacked structure of a first lower conductive layer 215a and a first upper conductive layer 215b. The first lower conductive layer 215a can include the same material as the first semiconductor pattern. For example, the source region of the first semiconductor pattern can be in direct contact with the first lower conductive layer 215a of the first source electrode 215. The first upper conductive layer 215b can be disposed on the first lower conductive layer 215a. The first upper conductive layer 215b can be in direct contact with the first lower conductive layer 215a. The first upper conductive layer 215b can have a resistance lower than the first lower conductive layer 215a. For example, the first upper conductive layer 215b can include a metal, such as aluminum (Al), chrome (Cr), copper (Cu), molybdenum (Mo), titanium (Ti) and tungsten (W). The first drain electrode can have the same structure as the first source electrode. For example, the first drain electrode can have a stacked structure of a first lower conductive layer and a first upper conductive layer. The first lower conductive layer of the first drain electrode can include the same material as the first semiconductor pattern. The first lower conductive layer of the first drain electrode can be in direct contact with the first semiconductor pattern. For example, the first semiconductor pattern, the first lower conductive layer 215a of the first source electrode 215 and the first lower conductive layer of the first drain electrode can be physically connected to each other, and be viewed as one pattern.

The second source electrode 225 can be electrically connected to the source region of the second semiconductor pattern 221. The second drain electrode 227 can be electrically connected to the drain region of the second semiconductor pattern 221. For example, each of the second source electrode 225 and the second drain electrode 227 can be in direct contact with the second semiconductor pattern 221. The second source electrode 225 and the second drain electrode 227 can have a multi-layer structure. The second drain electrode 227 can have the same structure as the second source electrode 225. For example, each of the second source electrode 225 and the second drain electrode 227 can have a stacked structure of a second lower conductive layer 225a and 227a and a second upper conductive layer 225b and 227b. The second lower conductive layer 225a and 227a can include the same material as the second semiconductor pattern 221. For example, the source region of the second semiconductor pattern 221 can be in direct contact with the second lower conductive layer 225a of the second source electrode 225, and the drain region of the second semiconductor pattern 221 can be in direct contact with the second lower conductive layer 227a of the second drain electrode 227. The second semiconductor pattern 221, the second lower conductive layer 225a of the second source electrode 225 and the second lower conductive layer 227a of the second drain electrode 227 can be physically connected to each other, and be viewed as one pattern. The second upper conductive layer 225b and 227b can be disposed on the second lower conductive layer 225a and 227a. The second upper conductive layer 225b and 227b can be in direct contact with the second lower conductive layer 225a and 227a. The second upper conductive layer 225b and 227b can have a resistance lower than the second lower conductive layer 225a and 227a. For example, the second upper conductive layer 225b and 227b can include a metal, such as aluminum (Al), chrome (Cr), copper (Cu), molybdenum (Mo), titanium (Ti) and tungsten (W).

The third thin film transistor T3 can include a third semiconductor pattern 231, a third gate electrode 233, a third source electrode 235 and a third drain electrode 237. The third thin film transistor T3 can reset the storage capacitor Cst according to the gate signal. For example, the third gate electrode 233 of the third thin film transistor T3 can be electrically connected to one of the gate lines GL, the third source electrode 235 of the third thin film transistor T3 can be connected to one of reference voltage supply lines RL, and the third drain electrode 237 of the third thin film transistor T3 can be electrically connected to the storage capacitor Cst.

The third semiconductor pattern 231 can include a semiconductor material. For example, the third semiconductor pattern 231 can include an oxide semiconductor, such as IGZO. The third semiconductor pattern 231 can include the same material as the second semiconductor pattern 221. The third semiconductor pattern 231 can be disposed on the same layer as the second semiconductor pattern 221. For example, the third semiconductor pattern 231 can be formed simultaneously with the second semiconductor pattern 221. The third semiconductor pattern 231 can have the same structure as the second semiconductor pattern 221. For example, the third semiconductor pattern 231 can include a channel region between a source region and a drain region.

The third gate electrode 233 can include a conductive material. For example, the third gate electrode 233 can include a metal, such as aluminum (Al), chrome (Cr), copper (Cu), molybdenum (Mo), titanium (Ti) and tungsten (W). The third gate electrode 233 can include the same material as the second gate electrode 223. The third gate electrode 233 can be disposed on the same layer as the second gate electrode 223. For example, the third gate electrode 233 can be formed simultaneously with the second gate electrode 223.

The third gate electrode 233 can be disposed on the third semiconductor pattern 231. For example, the third gate electrode 233 can overlap the channel region of the third semiconductor pattern 231. The third gate electrode 233 can be insulated from the third semiconductor pattern 231. For example, the channel region of the third semiconductor pattern 231 can have an electrical conductivity corresponding to a voltage applied to the third gate electrode 233.

The third source electrode 235 and the third drain electrode 237 can include a conductive material. The third drain electrode 237 can include the same material as the third source electrode 235. The third drain electrode 237 can be disposed on the same layer as the third source electrode 235. For example, the third drain electrode 237 can be formed simultaneously with the third source electrode 235. The third drain electrode 237 can include the same material as the second drain electrode 227. For example, the third source electrode 235 and the third drain electrode 237 can be formed simultaneously with the second source electrode 225 and the second drain electrode 227.

The third source electrode 235 can be electrically connected to the source region of the third semiconductor pattern 231. The third drain electrode 237 can be electrically connected to the drain region of the third semiconductor pattern 231. For example, each of the third source electrode 235 and the third drain electrode 237 can be in direct contact with the third semiconductor pattern. The third source electrode 235 and the third drain electrode 237 can have a multi-layer structure. For example, the third source electrode 235 and the third drain electrode 237 can have a stacked structure of a third lower conductive layer 235a and 237a and a third upper conductive layer 235b and 237b. The third lower conductive layer 235a and 237a can include the same material as the third semiconductor pattern 231. For example, the source region of the third semiconductor pattern 231 can be in direct contact with the third lower conductive layer 235a of the third source electrode 235, and the drain region of the third semiconductor pattern 231 can be in direct contact with the third lower conductive layer 237a of the third drain electrode 237. The third semiconductor pattern 231, the third lower conductive layer 235a of the third source electrode 235 and the third lower conductive layer 237a of the third drain electrode 237 can be physically connected to each other, and be viewed as one pattern. The third upper conductive layer 235b and 237b can be disposed on the third lower conductive layer 235a and 237a. The third upper conductive layer 235b and 237b can be in direct contact with the third lower conductive layer 235a and 237a. The third upper conductive layer 235b and 237b can have a resistance lower than the third lower conductive layer 235a and 237a. For example, the third upper conductive layer 235b and 237b can include a metal, such as aluminum (Al), chrome (Cr), copper (Cu), molybdenum (Mo), titanium (Ti) and tungsten (W).

The first thin film transistor T1, the second thin film transistor T2 and the third thin film transistor T3 of each pixel area PA can be disposed on a device substrate 100. The device substrate 100 can include an insulating material. The device substrate 100 can include a transparent material. For example, the device substrate 100 can include glass or plastic.

At least one of insulating layers 110, 120, 130, 140 and 150 can be disposed on the device substrate 100 to prevent unnecessary connection between the pixel driving circuit DC and the light-emitting device 500 of each pixel area PA. For example, a device buffer layer 110, a gate insulating layer 120, a lower passivation layer 130, an over-coat layer 140 and a bank insulating layer 150 can be disposed on the device substrate 100.

The device buffer layer 110 can include an insulating material. For example, the device buffer layer 110 can include an inorganic insulating material, such as silicon oxide (SiO) and silicon nitride (SiN). The device buffer layer 110 can include a multi-layer structure. For example, the device buffer layer 110 can have a stacked structure of a layer made of silicon nitride (SiN) and a layer made of silicon oxide (SiO).

The device buffer layer 110 can be disposed between the device substrate 100 and the thin film transistors T1, T2 and T3 of each pixel area PA. The device buffer layer 110 can prevent contamination due to the device substrate 100 in a process of forming the thin film transistors T1, T2 and T3. For example, an entire surface of the device substrate 100 toward the thin film transistors T1, T2 and T3 of each pixel area PA can be covered by the device buffer layer 110.

A light-blocking pattern 250 can be disposed between the device substrate 100 and the device buffer layer 110. The light-blocking pattern 250 can prevent a characteristics change of the thin film transistors T1, T2 and T3 in each pixel area PA due to external light. For example, the semiconductor pattern 221 and 231 of each thin film transistor T1, T2 and T3 can overlap the light-blocking pattern 250. The light-blocking pattern 250 can include a material capable of absorbing or reflecting the light. The light-blocking pattern 250 can include a conductive material. For example, the light-blocking pattern 250 can include a metal, such as aluminum (Al), chrome (Cr), copper (Cu), molybdenum (Mo), titanium (Ti) and tungsten (W).

The gate insulating layer 120 can include an insulating material. For example, the gate insulating layer 120 can include an inorganic insulating material, such as silicon oxide (SiO) and silicon nitride (SiN). The gate insulating layer 120 can include a material having a high dielectric constant. For example, the gate insulating layer 120 can include a High-K material, such as hafnium oxide (HfO). The gate insulating layer 120 can have a multi-layer structure.

The gate insulating layer 120 can be disposed on the device buffer layer 110. The gate insulating layer 120 can extend between the semiconductor pattern 221 and 231 and the gate electrode 223 and 233 of each thin film transistor T1, T2 and T3. For example, the gate insulating layer 120 can cover the first semiconductor pattern, the second semiconductor pattern 221 and the third semiconductor pattern 231 of each pixel area PA. The first gate electrode, the second gate electrode 223 and the third gate electrode 233 of each pixel area PA can be disposed on the gate insulating layer 120. For example, the gate electrode 223 and 233 of each thin film transistor T1, T2 and T3 can be insulated from the semiconductor pattern 221 and 231 of the corresponding thin film transistor T1, T2 and T3 by the gate insulating layer 120.

The source electrode 215, 225 and 235 and the drain electrode 227 and 237 of each thin film transistor T1, T2 and T3 can be disposed between the device buffer layer 110 and the gate insulating layer 120. For example, the source electrode 215, 225 and 235 and the drain electrode 227 and 237 of each thin film transistor T1, T2 and T3 can include a material different from the gate electrode 223 and 233 of the corresponding thin film transistor T1, T2 and T3.

The lower passivation layer 130 can include an insulating material. For example, the lower passivation layer 130 can include an inorganic insulating material, such as silicon oxide (SiO) and silicon nitride (SiN). The lower passivation layer 130 can be disposed on the gate insulating layer 120. The lower passivation layer 130 can prevent the damage of the thin film transistor T1, T2 and T3 in each pixel area PA due to external impact and moisture. For example, the gate electrode 223 and 233 of each thin film transistor T1, T2 and T3 can be covered by the lower passivation layer 130. The lower passivation layer 130 can extend along a surface of each thin film transistor T1, T2 and T3 opposite to the device substrate 100. For example, the lower passivation layer 130 covering the thin film transistors T1, T2 and T3 of each pixel area PA can be in direct contact with the lower passivation layer 130 covering the thin film transistors T1, T2 and T3 of adjacent pixel area PA.

The over-coat layer 140 can include an insulating material. The over-coat layer 140 can include a material different from the lower passivation layer 130. For example, the over-coat layer 140 can include an organic insulating material. The over-coat layer 140 can be disposed on the lower passivation layer 130. The over-coat layer 140 can remove a thickness difference due to the thin film transistors T1, T2 and T3 of each pixel area PA. For example, an upper surface of the over-coat layer 140 opposite to the device substrate 100 can be a flat surface.

The signal lines GL, DL, PL and RL can be formed on the device substrate 100. The signal lines GL, DL, PL and RL can be formed using a process of forming the thin film transistors T1, T2 and T3 in each pixel area PA. The gate lines GL can intersect with the data lines DL, the power voltage supply lines PL and the reference voltage supply lines RL. For example, the gate lines GL can be disposed on a layer different from the data lines DL, the power voltage supply lines PL and the reference voltage supply lines RL. The date lines DL can be disposed on the same layer as the power voltage supply lines PL and the reference voltage supply lines RL. For example, the data lines DL, the power voltage supply lines PL and the reference voltage supply lines RL can be disposed on the same layer as the light-blocking pattern 250, and the gate lines GL can be disposed on the same layer as the gate electrode 223 and 233 of each thin film transistor T1, T2 and T3. For example, the gate lines GL can include the same material as the gate electrode 223 and 233 of each thin film transistor T1, T2 and T3, and the data lines DL, the power voltage supply lines PL and the reference voltage supply lines RL can include the same material as the light-blocking pattern 250. The gate electrode 223 and 233 of each thin film transistor T1, T2 and T3 can be formed simultaneously with the gate lines GL, and the data lines DL, the power voltage supply lines PL and the reference voltage supply lines RL can be formed simultaneously with the light-blocking pattern 250.

The storage capacitor Cst of the pixel driving circuit DC in each pixel area PA can maintain the signal applied to the second gate electrode 223 of the corresponding pixel area PA for one frame. For example, the storage capacitor Cst of each pixel area PA can be electrically connected between the second gate electrode 223 and the second drain electrode 227 of the corresponding pixel area PA.

The storage capacitor Cst of each pixel area PA can have a structure in which at least two capacitor electrode 251, 252 and 253 are stacked. For example, the storage capacitor Cst of each pixel area PA can have a stacked structure of a first capacitor electrode 251 and a second capacitor electrode 252.

The first capacitor electrode 251 can be disposed between the device buffer layer 110 and the gate insulating layer 120. The first capacitor electrode 251 can have a multi-layer structure. For example, the first capacitor electrode 251 can have a stacked structure of a first electrode layer 251a and a second electrode layer 251b. The first capacitor electrode 251 can have the same structure as the source electrode 225 and 235 and the drain electrode 227 and 237 of each thin film transistor T1, T2 and T3. For example, the first electrode layer 251a can include the same material as the lower conductive layer 215a, 225a, 227a, 235a and 237a of each thin film transistor T1, T2 and T3, and the second electrode layer 251b can include the same material as the upper conductive layer 215b, 225b, 227b, 235b and 237b of each thin film transistor T1, T2 and T3. The first electrode layer 251a of the first capacitor electrode 251 in each pixel area PA can be in direct contact with the second lower conductive layer 227a of the second thin film transistor 227 in the corresponding pixel area PA. For example, the first electrode layer 251a of the first capacitor electrode 251 in each pixel area PA can be physically connected to the second lower conductive layer 227a of the second thin film transistor 227 in the corresponding pixel area PA, such that the first electrode layer 251a of the first capacitor electrode 251 and the second lower conductive layer 227a of the second thin film transistor 227 in each pixel area PA can be viewed as one pattern.

The second capacitor electrode 252 can be disposed between the gate insulating layer 120 and the lower passivation layer 130. The second capacitor electrode 252 can include a conductive material. For example, the second capacitor electrode 252 can include a metal, such as aluminum (Al), chrome (Cr), copper (Cu), molybdenum (Mo), titanium (Ti) and tungsten (W). The second capacitor electrode 252 can include the same material as the gate electrode 223 and 233 of each thin film transistor T1, T2 and T3. For example, the second capacitor electrode 252 can be formed simultaneously with the gate electrode 223 and 233 of each thin film transistor T1, T2 and T3. The second capacitor electrode 252 in each pixel area PA can be in direct contact with the second gate electrode 223 of the second thin film transistor T2 in the corresponding pixel area PA. For example, the second capacitor electrode 252 in each pixel area PA can be physically connected to the second gate electrode 223 of the second thin film transistor T2 in the corresponding pixel area PA, and the second capacitor electrode 252 and the second gate electrode 223 of the second thin film transistor T2 in each pixel area PA can be viewed as one pattern.

A conductive pattern 301 and 302 can be disposed on a portion of each date line DL and a portion of each power voltage supply line PL. For example, a data conductive pattern 301 can be disposed on a portion of each data line DL, and the power conductive pattern 302 can be disposed on a portion of each power voltage supply line PL. The data conductive pattern 301 can be electrically connected to the corresponding data line DL, and the power conductive pattern 302 can be electrically connected to the corresponding power voltage supply line PL. Thus, in the display apparatus according to the embodiment of the present disclosure, a resistance of each data line DL and/or a resistance of each power voltage supply line PL can be reduced by the conductive patterns 301 and 302. Therefore, in the display apparatus according to the embodiment of the present disclosure, the delay of the data signal and/or the luminance deviation due to voltage drop due to wiring resistance can be prevented. In embodiments of the present disclosure, the conductive pattern 301 can connect to the data line DL as an elongate area of contact (see FIG. 9) or multiple areas of contact (see FIG. 10). If the connection occurs via the multiple areas, extensions for the conductive pattern 301 may extend through at least the device buffer layer 110.

The conductive patterns 301 and 302 can include a material having relatively low resistance. The conductive patterns 301 and 302 can be formed using a process of forming the pixel driving circuit DC in each pixel area PA. For example, the conductive patterns 301 and 302 can include the same material as the gate electrode 223 and 233 of each thin film transistor T1, T2 and T3. The conductive patterns 301 and 302 can be formed simultaneously with the gate electrode 223 and 233 of each thin film transistor T1, T2 and T3. For example, the conductive patterns 301 and 302 can be disposed on the same layer as the gate electrode 223 and 233 of each thin film transistor T1, T2 and T3. The conductive patterns 301 and 302 can be disposed between the gate insulating layer 120 and the lower passivation layer 130.

The data conductive pattern 301 can be disposed on the same layer as the second capacitor electrode 252 of each pixel area PA. An end ep of the first capacitor electrode 251 toward the data line DL in each pixel area PA can protrude more in a direction of the data line DL than the second capacitor electrode 252 of the corresponding pixel area PA. For example, an end ep of the first capacitor electrode 251 toward the data line DL in each pixel area PA can be disposed between the second capacitor electrode 252 of the corresponding pixel area PA and the data line DL. For example, in the display apparatus according to the embodiment of the present disclosure, the first capacitor electrode 251 of each pixel area PA can have a size larger than the second capacitor electrode 252 of the corresponding pixel area PA. Thus, in the display apparatus according to the embodiment of the present disclosure, a distance between the second capacitor electrode 252 of each pixel area PA and the data conductive pattern 301 can be increased. Therefore, in the display apparatus according to the embodiment of the present disclosure, the influence of the data signal on the storage capacitor Cst of each pixel area PA through the data conductive pattern 301 can be minimized.

The light-emitting device 500 of each pixel area PA can be disposed on the over-coat layer 140 of the corresponding pixel area PA. For example, the light-emitting device 500 of each pixel area PA can include a first electrode 510, a light-emitting layer 520 and a second electrode 530, which are sequentially stacked on the over-coat layer 140.

The first electrode 510 can include a conductive material. The first electrode 510 can have a high transmittance. For example, the first electrode 510 can be a transparent electrode made of a transparent conductive material, such as ITO and IZO.

The first electrode 510 of each pixel area PA can be electrically connected to the pixel driving circuit DC of the corresponding pixel area PA. For example, the first electrode 510 of each pixel area PA can penetrate the gate insulating layer 120, the lower passivation layer 130 and the over-coat layer 140. The first electrode 510 of each pixel area PA can be connected to the pixel driving circuit DC of the corresponding pixel area PA through an intermediate electrode 273. The intermediate electrode 273 can be disposed between the gate insulating layer 120 and the lower passivation layer 130. For example, the intermediate electrode 273 can include the same material as the gate electrode 223 and 233 of each thin film transistor T1, T2 and T3. The intermediate electrode 273 can be formed simultaneously with the gate electrode 223 and 233 of each thin film transistor T1, T2 and T3. Thus, in the display apparatus according to the embodiment of the present disclosure, the first electrode 510 of each pixel area PA can be stably connected to the pixel driving circuit DC of the corresponding pixel area PA, without decreasing the process efficiency.

The light-emitting layer 520 can generate light having luminance corresponding to a voltage difference between the first electrode 510 and the second electrode 530. For example, the light-emitting layer 520 can include an emission material layer (EML) having an emission material. The emission material can include an organic material, an inorganic material or a hybrid material. For example, the display apparatus according to the embodiment of the present disclosure can be an organic light-emitting display apparatus including an organic emission material.

The light-emitting layer 520 can have a multi-layer structure. For example, the light-emitting layer 520 can further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 520 can be improved.

The second electrode 530 can include a conductive material. The second electrode 530 can include a material different from the first electrode 510. For example, the transmittance of the second electrode 530 can be lower than the transmittance of the first electrode 510. The second electrode 530 can have a reflectance higher than the first electrode 510. For example, the second electrode 530 can include a metal, such as aluminum (Al) and silver (Ag). Thus, in the display apparatus according to the embodiment of the present disclosure, the light generated by the light-emitting layer 520 can be emitted through the first electrode 510.

A bank insulating layer 150 can be disposed on the over-coat layer 140. The bank insulating layer 150 can include an insulating material. For example, the bank insulating layer 150 can include an organic insulating material. The bank insulating layer 150 can include a material different from the over-coat layer 140.

The first electrode 510 of each light-emitting device 500 can be insulated from the first electrode 510 of adjacent light-emitting device 500 by the bank insulating layer 150. For example, the bank insulating layer 150 can cover an edge of the first electrode 510 in each pixel area PA. Thus, in the display apparatus according to the embodiment of the present disclosure, the light-emitting device 500 of each pixel area PA can be independently controlled by the bank insulating layer 150. The light-emitting layer 520 and the second electrode 530 of each light-emitting device 500 can be stacked on a portion of the corresponding first electrode 510 exposed by the bank insulating layer 150. For example, the bank insulating layer 150 can define emission areas REA, BEA, WEA and GEA corresponding to red, blue, white and green in each pixel area PA.

The emission area REA, BEA, WEA and GEA of each pixel area PA defined by the bank insulating layer 150 need not overlap with the pixel driving circuit DC of the corresponding pixel area PA. For example, the thin film transistors T1, T2 and T3 of each pixel area PA can be disposed outside the emission area REA, BEA, WEA and GEA of the corresponding pixel area PA. Thus, in the display apparatus according to the embodiment of the present disclosure, the light emitted from the light-emitting device 500 of each pixel area PA may be not blocked by the thin film transistors T1, T2 and T3 of the corresponding pixel area PA.

The light-emitting layer 520 of each light-emitting device 500 can be connected to the light-emitting layer 520 of adjacent light-emitting device 500. For example, the light-emitting layer 520 of each light-emitting device 500 can extend on the bank insulating layer 150. The light emitted from the light-emitting device 500 of each pixel area PA can display the same color as the light emitted from the light-emitting device 500 of adjacent pixel area PA. For example, the light-emitting layer 520 of each pixel area PA can generate white light.

Each of the pixel areas PA can realize a color different from adjacent pixel area PA. For example, the emission area REA, BEA, WEA and GEA defined by the bank insulating layer 150 can include a red emission area REA realizing red color, a blue emission area BEA realizing blue color, a white emission area WEA realizing white color and a green emission area GEA realizing green color. Each of the pixel area PA can include a color filter 400 overlapping with the emission area REA, BEA, WEA and GEA of the corresponding pixel area PA. The color filter 400 can realize a specific color using the light passing through the corresponding color filter 400. For example, the color filter 400 of each pixel area PA can be disposed on a path of the light emitted from the light-emitting device 500 in the corresponding pixel area PA. The color filter 400 of each pixel area PA can be disposed between the device substrate 100 and the light-emitting device 500 of the corresponding pixel area PA. For example, the color filter 400 of each pixel area PA can be disposed between the lower passivation layer 130 and the over-coat layer 140. A thickness difference due to the color filter 400 of each pixel area PA can be removed by the over-coat layer 140.

A voltage applied to the second electrode 530 of each light-emitting device 500 can be the same as a voltage applied to the second electrode 530 of adjacent light-emitting device 500. For example, the second electrode 530 of each light-emitting device 500 can be electrically connected to the second electrode 530 of adjacent light-emitting device 500. The second electrode 530 of each light-emitting device 500 can include the same material as the second electrode 530 of adjacent light-emitting device 500. For example, the second electrode 530 of each light-emitting device 500 can be formed simultaneously with the second electrode 530 of adjacent light-emitting device 500. Thus, in the display apparatus according to the embodiment of the present disclosure, a process of forming the second electrode 530 of each light-emitting device 500 can be simplified.

An encapsulation substrate 700 can be disposed on the second electrode 530 of each light-emitting device 500. The encapsulation substrate 700 can prevent the damage of the light-emitting devices 500 due to the external impact and moisture. For example, the encapsulation substrate 700 can include a material having a specific hardness. For example, the encapsulation substrate 700 can include a material having relatively high thermal conductivity. For example, the encapsulation substrate 700 can include a metal, such as aluminum (Al), nickel (Ni) and iron (Fe). Thus, in the display apparatus according to the embodiment of the present disclosure, the heat generated by the pixel driving circuit DC and the light-emitting device 500 of each pixel area PA can be dissipated through the encapsulation substrate 700. Therefore, in the display apparatus according to the embodiment of the present disclosure, the deterioration of the light-emitting layers 520 can be minimized.

The encapsulation substrate 700 can be attached on the device substrate 100 in which the light-emitting devices 500 are formed. For example, an encapsulating element 600 can be disposed in a space between the light-emitting devices 500 and the encapsulation substrate 700. The encapsulating element 600 can include an adhesive material. The encapsulating element 600 can include an insulating material. For example, the encapsulating element 600 can include an olefin based material. The encapsulating element 600 can have a relatively low water vapor transmission rate (WVTR). Thus, in the display apparatus according to the embodiment of the present disclosure, the penetration of external moisture through the encapsulating element 600 can be prevented. In various embodiments of the present disclosure, reference to an element or a layer being disposed on a same layer as another element or a layer can include the element or the layer being the same layer or parts of a same layer as the another element or the another layer based on both being formed in the same and/or simultaneous process and/or using the same material.

Accordingly, in the display apparatus according to the embodiment of the present disclosure, the pixel driving circuit DC of each pixel area PA can include the storage capacitor Cst, the storage capacitor Cst can include the first capacitor electrode 251 having the same structure as the source electrode 215, 225 and 235 and the drain electrode 227 and 237 of each thin film transistor T1, T2 and T3, and the second capacitor electrode 252 including the same material as the gate electrode 223 and 233 of each thin film transistor T1, T2 and T3, and the data conductive pattern 301 disposed on a portion of each data line DL can be disposed on the same layer as the second capacitor electrode 252, wherein the end ep of the first capacitor electrode 251 toward the corresponding data line DL can be disposed between the second capacitor electrode 252 and the data conductive pattern 301. Thus, in the display apparatus according to the embodiment of the present disclosure, the change of the voltage stored in the storage capacitor Cst due to the data conductive pattern 301 can be minimized. And, in the display apparatus according to the embodiment of the present disclosure, a length of the data conductive pattern 301 can be increased. Therefore, in the display apparatus according to the embodiment of the present disclosure, the resistance of the data lines DL can be reduced, without the distortion of the voltage stored in the storage capacitor Cst of each pixel area PA due to the data signal applied through the data lines DL.

Figure 9:
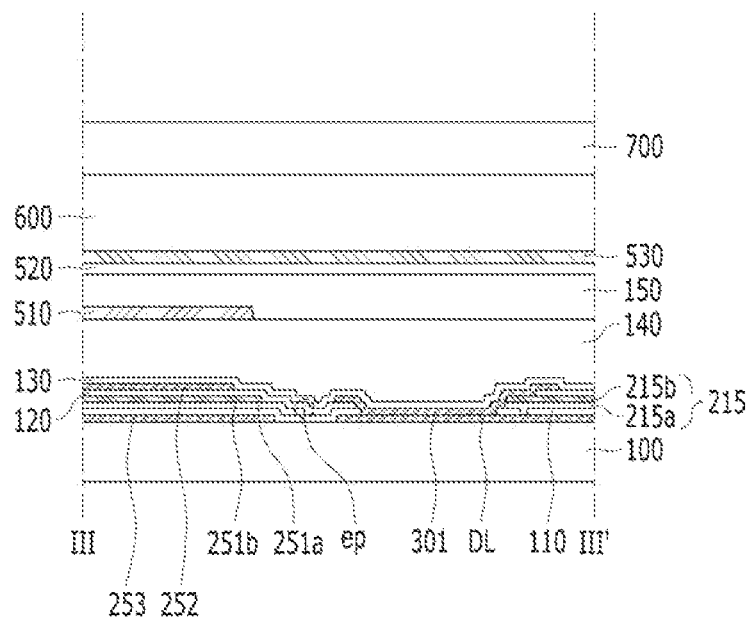
FIGS. 9 and 10 are views showing the display apparatus according to another embodiment of the present disclosure, respectively.

In the display apparatus according to the embodiment of the present disclosure, the storage capacitor Cst of each pixel area PA can include a third capacitor electrode 253 disposed on the same layer as the light-blocking pattern 250. For example, the third capacitor electrode 253 can be disposed on the same layer as the data line DL. The end ep of the first capacitor electrode 251 can be disposed between the third capacitor electrode 253 and the data line DL. Thus, in the display apparatus according to the embodiment of the present disclosure, the capacity of the storage capacitor Cst in each pixel area PA can be sufficiently secured, and the distortion of the voltage stored in each storage capacitor Cst due to the data signal applied through the data lines DL can be prevented. A The display apparatus according to the embodiment of the present disclosure is described that an end of the second electrode layer 251b of the first capacitor electrode 251 is disposed close to the end ep of the first electrode layer 251a of the first capacitor electrode 251. However, in the display apparatus according to another embodiment of the present disclosure, the end of the second electrode layer 251b of the first capacitor electrode 251 can be disposed close to an end of the second capacitor electrode 252, as shown in FIG. 9. For example, a distance between the end of the second electrode layer 251b and the second capacitor electrode 252 can be smaller than a distance between the end ep of the first electrode layer 251a and the end of the second electrode layer 252a. Thus, in the display apparatus according to the embodiment of the present disclosure, the distortion of the voltage stored in each storage capacitor Cst due to the date signal can be effectively prevented or reduced.

Figure 10:
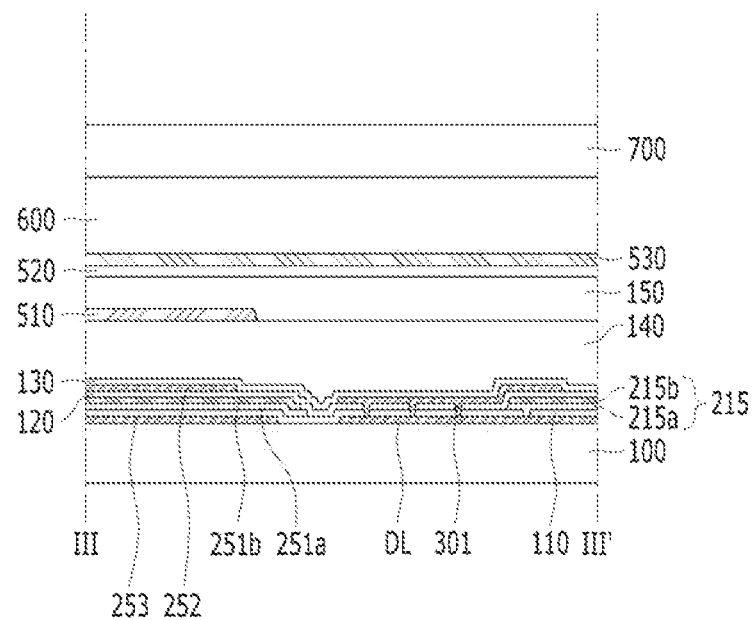

The display apparatus according to the embodiment of the present disclosure is described that a central portion of the data conductive pattern 301 is in direct contact with the data line DL. However, in the display apparatus according to another embodiment of the present disclosure, the data line DL and the data conductive pattern 310 can be connected by various ways. For example, in the display apparatus according to another embodiment of the present disclosure, the data conductive pattern 310 can be connected to the data line DL by partially penetrating the device buffer layer 110 and the gate insulating layer 120, as shown in FIG. 10. Therefore, in the display apparatus according to the embodiment of the present disclosure, the degree of freedom for electrical connection between the data conductive pattern 310 and the data line DL can be improved.

In the result, the display apparatus according to the embodiments of the present disclosure can comprise the pixel driving circuit including the storage capacitor, wherein the data conductive pattern on a portion of the data line can be electrically connected to the data line, wherein the storage capacitor can include the first capacitor electrode disposed on a layer different from the data line and the data conductive pattern, and the second capacitor electrode disposed on the same layer as the data conductive pattern, and wherein the end of the first capacitor electrode toward the data line can be disposed between the second capacitor electrode and the data conductive pattern. Thus, in the display apparatus according to the embodiments of the present disclosure, the influence of the data signal on the storage capacitor Cst can be sufficiently reduced. Thereby, in the display apparatus according to the embodiments of the present disclosure, the distortion of the voltage stored in the storage capacitor due to the data signal can be prevented.

What is claimed is:
1. A display apparatus comprising:
a device buffer layer on a device substrate;
a data line between the device substrate and the device buffer layer;
a pixel driving circuit on the device buffer layer, the pixel driving circuit including a capacitor being spaced away from the data line;
a data conductive pattern on the device buffer layer, the data conductive pattern overlapping with a portion of the data line;
an over-coat layer on the pixel driving circuit and the data conductive pattern; and a light-emitting device on the over-coat layer, the light-emitting device electrically connected to the pixel driving circuit, wherein the storage capacitor includes a first capacitor electrode and a second capacitor electrode on the first capacitor electrode, wherein the data conductive pattern electrically connected to the data line is disposed on a same layer as the second capacitor electrode, and wherein an end of the first capacitor electrode toward the data line is disposed between the data conductive pattern and the second capacitor electrode.

2. The display apparatus according to claim 1, wherein the pixel driving circuit further includes a driving thin film transistor electrically connected to the light-emitting device, and wherein the first capacitor electrode is disposed on a same layer as a semiconductor pattern of the driving thin film transistor and includes a same material as the semiconductor pattern.

3. The display apparatus according to claim 2, wherein a drain electrode of the driving thin film transistor is disposed on a same layer as the first capacitor electrode and includes a same material as the first capacitor electrode.

4. The display apparatus according to claim 2, wherein the data conductive pattern, the second capacitor electrode, and a gate electrode of the driving thin film transistor are disposed on a same layer and includes a same material.

5. The display apparatus according to claim 4, wherein the second capacitor electrode is in contact with the gate electrode of the driving thin film transistor.

6. The display apparatus according to claim 1, wherein the first capacitor electrode includes a first electrode layer and a second electrode layer on the first electrode layer and wherein the end of the first electrode layer is disposed between an end of the second electrode layer and the data line.

7. The display apparatus according to claim 6, wherein a distance between the end of the second electrode layer and the second capacitance electrode is smaller than a distance between the end of the first electrode layer and the end of the second electrode layer.

8. The display apparatus according to claim 1, wherein the data conductive pattern has a shape of a bar extending along the data line.

9. The display apparatus according to claim 1, wherein the storage capacitor includes a third capacitor electrode being disposed on a same layer as the data line, and wherein an end of the second capacitor electrode is disposed between the third capacitor electrode and the data line.

10. A display apparatus comprising:
a gate line extending in a first direction on a substrate;
a data line extending in a second direction on the substrate;
a pixel circuit on the substrate, and including a first thin film transistor (TFT), a second thin film transistor (TFT), and a storage capacitor, the first TFT configured to transmit a data signal from the data line to the second TFT according to a gate signal from the gate line; and
a conductive pattern electrically connected to the data line, wherein the storage capacitor includes a first capacitor electrode and a second capacitor electrode, and wherein a first distance from an edge of the first capacitor electrode to an edge of the conductive pattern is different from a second distance from an edge of the second capacitor electrode to the edge of the conductive pattern.

11. The display apparatus of claim 10, wherein the first distance is less than the second distance, and wherein the first distance and the second distance are measured in the first direction.

12. The display apparatus of claim 10, further comprising a gate insulating layer interposed between the first capacitor electrode and the second capacitor electrode in a third direction intersecting the first direction and the second direction.

13. The display apparatus of claim 12, wherein the gate insulating layer is interposed between the first capacitor electrode and the conductive pattern in the first direction.

14. The display apparatus of claim 10, wherein the edge of the first capacitor electrode is not coplanar with a remaining portion of the first capacitor electrode.

15. The display apparatus of claim 10, wherein the storage capacitor further includes a third capacitor electrode on the substrate, and is separated from the first capacitor electrode, and wherein a third distance from an edge of the third capacitor electrode to the edge of the conductive pattern is greater than the first distance from the edge of the first capacitor electrode to the edge of the conductive pattern.

16. The display apparatus of claim 10, wherein the first distance being less than the second distance prevents a distortion of a voltage stored in the storage capacitor due to the data signal that is applied through the data line.

17. The display apparatus of claim 10, further comprising:
a light emitting device,
wherein the first TFT is electrically connected to the light emitting device, and
wherein a source of the first TFT is electrically connected to the conductive pattern.

18. The display apparatus of claim 10, wherein the first capacitor electrode is disposed on a same layer as an active layer of the first thin film transistor.

19. The display apparatus of claim 10, wherein the conductive pattern and the second capacitor electrode are disposed on a same layer as a gate electrode of the first TFT.

20. The display apparatus of claim 10, wherein the first capacitor electrode includes a first electrode layer and a second electrode layer, and wherein a resistance of the second electrode layer is less than a resistance of the first electrode layer.

* * * * *